US008723324B2

(12) United States Patent
Camacho et al.

(10) Patent No.: US 8,723,324 B2
(45) Date of Patent: May 13, 2014

(54) INTEGRATED CIRCUIT PACKAGING SYSTEM WITH PAD CONNECTION AND METHOD OF MANUFACTURE THEREOF

(75) Inventors: Zigmund Ramirez Camacho, Singapore (SG); Henry Descalzo Bathan, Singapore (SG); Emmanuel Espiritu, Singapore (SG); Dioscoro A. Merilo, Singapore (SG)

(73) Assignee: Stats ChipPac Ltd., Singapore (SG)

( * ) Notice: Subject to any disclaimer, the term of this patent is extended or adjusted under 35 U.S.C. 154(b) by 267 days.

(21) Appl. No.: 12/961,489

(22) Filed: Dec. 6, 2010

(65) Prior Publication Data
US 2012/0139104 A1 Jun. 7, 2012

(51) Int. Cl.
*H01L 23/48* (2006.01)
*H01L 21/56* (2006.01)

(52) U.S. Cl.
USPC ........... 257/773; 257/737; 257/778; 257/779; 257/784; 257/786; 257/787; 257/E21.502; 257/E23.01; 438/127

(58) Field of Classification Search
CPC ........... H01L 2224/97; H01L 2224/48247; H01L 2224/16245; H01L 2224/73265; H01L 2924/00; H01L 2924/14; H01L 21/4832; H01L 24/16
USPC .......... 257/773, 778, 779, 784, 786, 787
See application file for complete search history.

(56) References Cited

U.S. PATENT DOCUMENTS

| | | | |
|---|---|---|---|
| 5,656,550 A | 8/1997 | Tsuji et al. | |
| 5,847,458 A * | 12/1998 | Nakamura et al. | 257/738 |
| 6,020,626 A * | 2/2000 | Ohsawa et al. | 257/668 |
| 6,255,740 B1 * | 7/2001 | Tsuji et al. | 257/792 |
| 7,049,177 B1 | 5/2006 | Fan et al. | |
| 7,129,116 B2 | 10/2006 | Islam et al. | |
| 7,312,105 B2 | 12/2007 | Huang et al. | |
| 7,838,975 B2 | 11/2010 | Chen | |
| 7,993,979 B2 * | 8/2011 | Do et al. | 438/123 |
| 8,063,470 B1 * | 11/2011 | Sirinorakul et al. | 257/666 |
| 2008/0093717 A1 * | 4/2008 | Huang et al. | 257/673 |

OTHER PUBLICATIONS

U.S. Appl. No. 12/961,490, filed Dec. 6, 2010, Bathan et al.

* cited by examiner

*Primary Examiner* — Matthew W Such
*Assistant Examiner* — David Spalla
(74) *Attorney, Agent, or Firm* — Ishimaru & Associates LLP

(57) ABSTRACT

A method of manufacture of an integrated circuit packaging system includes: forming a lead having a lead bottom side and a lead top side; applying a passivation over the lead with the lead top side exposed from the passivation; forming an interconnect structure directly on the passivation and the lead top side, the interconnect structure having an inner pad and an outer pad with a recess above the lead top side; mounting an integrated circuit over the inner pad and the passivation; and molding an encapsulation over the integrated circuit.

20 Claims, 7 Drawing Sheets

US 8,723,324 B2

INTEGRATED CIRCUIT PACKAGING SYSTEM WITH PAD CONNECTION AND METHOD OF MANUFACTURE THEREOF

TECHNICAL FIELD

The present invention relates generally to an integrated circuit packaging system, and more particularly to a system for an integrated circuit packaging system with connection.

BACKGROUND ART

Modern electronics, such as smart phones, personal digital assistants, location based services devices, enterprise class servers, or enterprise class storage arrays, are packing more integrated circuits into an ever-shrinking physical space with expectations for decreasing cost. Numerous technologies have been developed to meet these requirements. Some of the research and development strategies focus on new technologies while others focus on improving the existing and mature technologies. Research and development in the existing technologies can take a myriad of different directions.

Consumer electronics requirements demand more integrated circuits in an integrated circuit package while paradoxically providing less physical space in the system for the increased integrated circuits content. Continuous cost reduction is another requirement. Some technologies primarily focus on integrating more functions into each integrated circuit. Other technologies focus on stacking these integrated circuits into a single package. While these approaches provide more functions within an integrated circuit, they do not fully address the requirements for lower height, smaller space, and cost reduction.

One proven way to reduce cost is to use mature package technologies with existing manufacturing methods and equipments. Paradoxically, the reuse of existing manufacturing processes does not typically result in the reduction of package dimensions. The demand still continues for lower cost, smaller size and more functionality.

Thus, a need still remains for an integrated circuit packaging system including lower cost, smaller size, and more functionality. In view of the ever-increasing need to improve integration and cost reduction, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: forming a lead having a lead bottom side and a lead top side; applying a passivation over the lead with the lead top side exposed from the passivation; forming an interconnect structure directly on the passivation and the lead top side, the interconnect structure having an inner pad and an outer pad with a recess above the lead top side; mounting an integrated circuit over the inner pad and the passivation; and molding an encapsulation over the integrated circuit.

The present invention provides an integrated circuit packaging system, including: a lead having a lead bottom side and a lead top side; a passivation over the lead with the lead top side exposed from the passivation; an interconnect structure directly on the passivation and the lead top side, the interconnect structure having an inner pad and an outer pad with a recess above the lead top side; an integrated circuit over the inner pad and the passivation; and an encapsulation over the integrated circuit.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
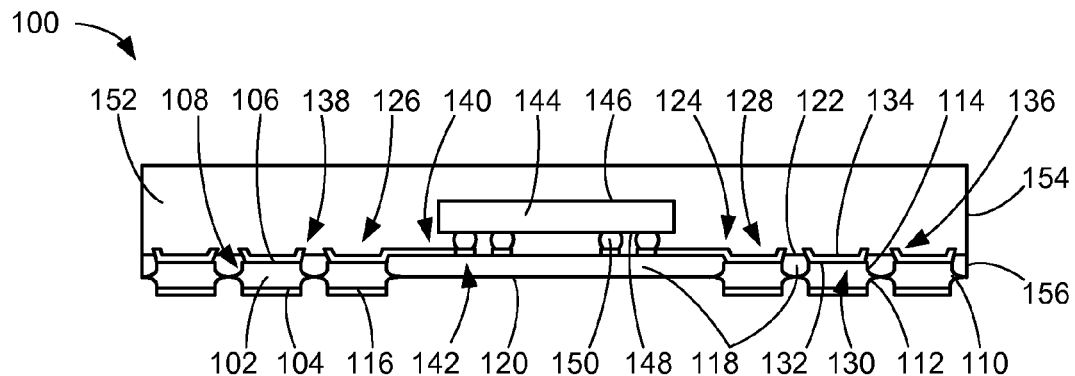
FIG. 1 is a cross-sectional view of an integrated circuit packaging system taken along line 1-1 of FIG. 2 in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" means that there is direct contact between elements. The term "directly on" means that there is direct contact between one element and another element without an intervening element.

The term "active side" refers to a side of a die, a module, a package, or an electronic structure having active circuitry fabricated thereon or having elements for connection to the active circuitry within the die, the module, the package, or the electronic structure. The term "processing" as used herein includes deposition of material or photoresist, patterning, exposure, development, etching, cleaning, and/or removal of the material or photoresist as required in forming a described structure.

Figure 2:
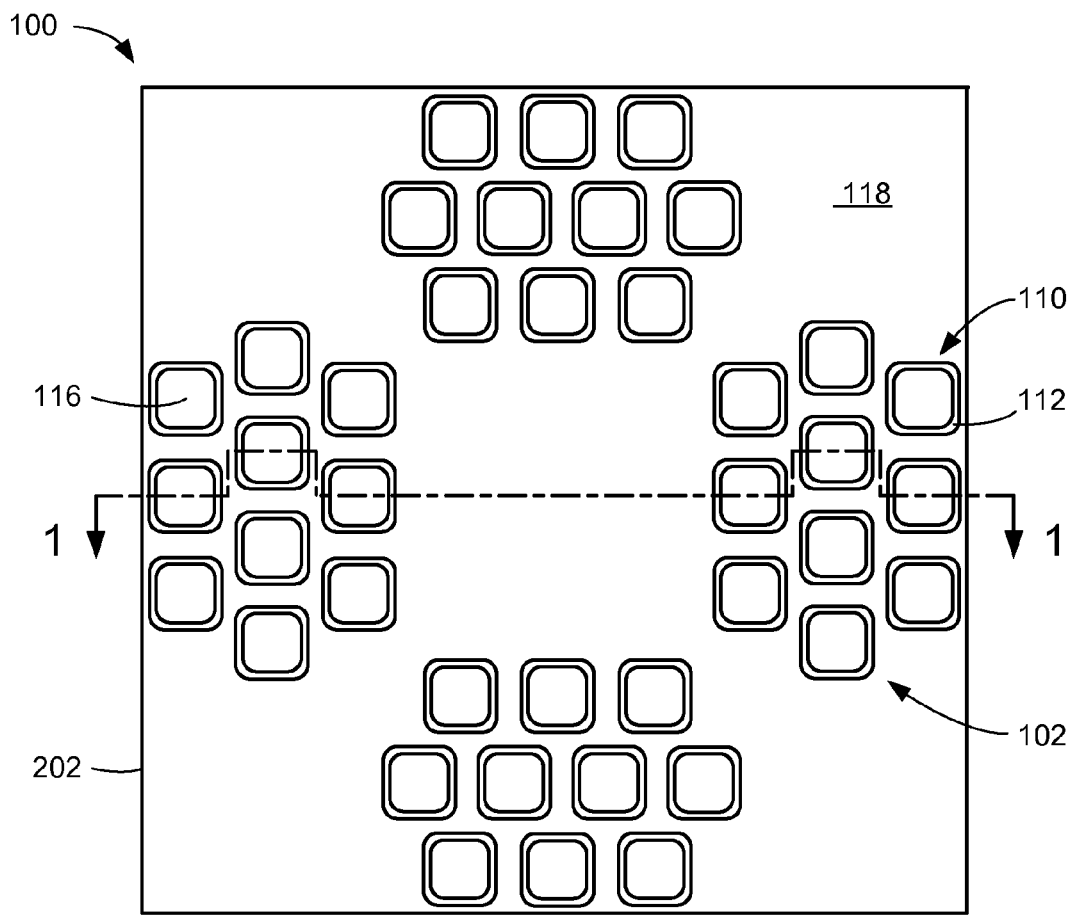
FIG. 2 is a bottom view of the integrated circuit packaging system.

Referring now to FIG. 1, therein is shown a cross-sectional view of an integrated circuit packaging system 100 taken along line 1-1 of FIG. 2 in a first embodiment of the present invention. The integrated circuit packaging system 100 can include a leadframe for a multi-row quad flat nonleaded (QFN) package with a flip chip.

The integrated circuit packaging system 100 can include a lead 102, which provides electrical connectivity between the integrated circuit packaging system 100 and an external system (not shown). The lead 102 can include a lead bottom side 104 and a lead top side 106 opposite the lead bottom side 104. The lead 102 can include a lead non-horizontal side 108 between the lead bottom side 104 and the lead top side 106.

The lead 102 can include a horizontal ridge 110, which is an end of the lead 102, horizontally protruding from the lead non-horizontal side 108. The horizontal ridge 110 can be formed between the lead bottom side 104 and the lead top side 106.

The horizontal ridge 110 can include a ridge lower side 112 and a ridge upper side 114 opposite the ridge lower side 112. The ridge upper side 114 can be above the ridge lower side 112.

The integrated circuit packaging system 100 can include a conductive layer 116, which provides an electrical connection between the lead 102 and an external system. The conductive layer 116 can be electrically connected to the lead 102. The conductive layer 116 can be formed directly on the lead bottom side 104.

The integrated circuit packaging system 100 can include a passivation 118, which protects a portion of the lead 102. The passivation 118 can electrically isolate the lead 102 and another of the lead 102.

The passivation 118 can be formed surrounding an upper portion of the lead 102. The passivation 118 can be formed over the horizontal ridge 110. The passivation 118 can be formed directly on the ridge upper side 114. A portion of the passivation 118 can be formed over the lead top side 106.

The passivation 118 can include a passivation bottom side 120 and a passivation top side 122 opposite the passivation bottom side 120. The passivation top side 122 can be above the lead top side 106.

The passivation bottom side 120 can extend between the horizontal ridge 110 of the lead 102 and another of the horizontal ridge 110 of another of the lead 102. The passivation bottom side 120 can be above the ridge lower side 112 or the conductive layer 116.

The integrated circuit packaging system 100 can include an interconnect structure 124, which is a structure that provides electrical connectivity between a semiconductor device and the lead 102. The interconnect structure 124 can include an outer pad 126, which provides electrical connectivity to the lead 102, over or directly on the lead top side 106. For example, the interconnect structure 124 can include a redistribution layer (RDL) on a multi-row copper leadframe.

The outer pad 126 can include a recess 128. The outer pad 126 can include a non-vertical base 130, which is a bottom of the outer pad 126, having a base bottom surface 132 and a base top surface 134 opposite the base bottom surface 132. The outer pad 126 can include a non-horizontal sidewall 136, which is a portion of the outer pad 126 that upwardly extends from the non-vertical base 130.

The outer pad 126 can include the base top surface 134 and the non-horizontal sidewall 136 bounding the recess 128. The outer pad 126 can include the non-horizontal sidewall 136 surrounding the recess 128.

The non-horizontal sidewall 136 can extend from the base top surface 134. The non-horizontal sidewall 136 can be formed at an obtuse angle with the base top surface 134. The non-horizontal sidewall 136 can include a top end 138, which is an extent at a top of the non-horizontal sidewall 136. The top end 138 can be above the passivation top side 122 and the base top surface 134.

For illustrative purposes, a plane of the base top surface 134 is shown coplanar with a plane of the passivation top side 122, although it is understood that the base top surface 134 and the passivation top side 122 can be at different planes. For example, a plane of the base top surface 134 can be below a plane of the passivation top side 122.

The interconnect structure 124 can include a conductive trace 140 and an inner pad 142. The conductive trace 140 provides or routes electrical connection between the outer pad 126 and the inner pad 142. The inner pad 142 provides mounting support and electrical connectivity to a semiconductor device.

The conductive trace 140 can be attached or connected to the top end 138 of the non-horizontal sidewall 136. The conductive trace 140 can be formed directly on the passivation top side 122. For example, the conductive trace 140 can include an electrical connector including a redistribution trace, a routed nickel-palladium (NiPd) layer, a pre plated frame (PPF) layer, or a redistribution layer (RDL).

The inner pad 142 can be attached or connected to the conductive trace 140. The inner pad 142 can be formed directly on the passivation top side 122.

The integrated circuit packaging system 100 can include an integrated circuit 144, which is a semiconductor device. The integrated circuit 144 can include an inactive side 146 and an active side 148 opposite the inactive side 146. For example, the integrated circuit 144 can include a semiconductor device including a flip chip or a silicon (Si) die.

The integrated circuit 144 can include the active side 148 facing the interconnect structure 124. The integrated circuit 144 can be mounted over the interconnect structure 124.

The integrated circuit packaging system 100 can include an internal connector 150, which is an electrically conductive connector. The internal connector 150 can be attached to the inner pad 142 and the active side 148. The internal connector 150 can be directly on the inner pad 142.

The integrated circuit packaging system 100 can include the passivation 118 electrically isolating the interconnect structure 124 from another of the interconnect structure 124. The integrated circuit packaging system 100 can include a number of the outer pad 126 surrounding or outside a perimeter of the integrated circuit 144. The integrated circuit packaging system 100 can include a number of the inner pad 142 under the inactive side 146 of the integrated circuit 144. Multiple rows of leads 102 are outside the perimeter of the integrated circuit 144.

The integrated circuit packaging system 100 can include an encapsulation 152, which covers a semiconductor package to seal a semiconductor device providing mechanical and environmental protection. The encapsulation 152 can be formed over the passivation 118, the interconnect structure 124, the integrated circuit 144, and the internal connector 150. The encapsulation 152 can be formed covering the passivation top side 122, the interconnect structure 124, the integrated circuit 144, and the internal connector 150.

The encapsulation 152 can include an encapsulation non-horizontal side 154, which is a horizontal extent of the encapsulation 152. A plane of the encapsulation non-horizontal side 154 can be coplanar with a plane of a passivation non-horizontal side 156 of the passivation 118. The passivation non-horizontal side 156 is a horizontal extent of the passivation 118.

It has been discovered that the interconnect structure 124 connected to the lead 102 and the integrated circuit 144 enables flip chip integrated circuit (IC) packaging in a multi-row quad flat nonleaded (QFN) package that has not so far been done due to limitations in leadframe designs thereby fulfilling a need to efficiently configure a multi-row quad flat nonleaded (QFN) package for a flip chip device.

It has also been discovered that the interconnect structure 124 having the conductive trace 140 attached to the outer pad 126 and the inner pad 142 provides a solution that does not use bismaleimide triazine (BT) laminate frames to redistribute flip chip signals in a quad flat nonleaded (QFN) package with multi-row leads.

It has further been discovered that the interconnect structure 124 provides a low cost quad flat nonleaded (QFN) flip chip packaging methodology due to simpler substrate construction and layering, elimination of solder balls, and elimination of laminate usage compared to organic substrate products, standard ball grid array (BGA) laminates, and embedded wafer level ball grid array (eWLB).

It has been unexpectedly found that the interconnect structure 124 having the conductive trace 140 directly on the passivation top side 122 and having the outer pad 126 attached to the lead top side 106 improves reliability by eliminating lead pullouts.

It has been unexpectedly determined that the outer pad 126 having the recess 128 surrounded by the non-horizontal sidewall 136 provides the non-vertical base 130 as a reliable connection site to attach or connect the lead 102 to a stack device thereby eliminating misalignment.

It has been unexpectedly recognized that the interconnect structure 124 protected by the passivation 118 is better for flip chip mounting compared to prior arts, which include traces on and surrounded only by bare copper, thereby eliminating solder collapse, solder creep, and misalignment.

It has been unexpectedly ascertained that the passivation 118 improves reliability by isolating the interconnect structure 124 from another of the interconnect structure 124 or the lead 102 from another of the lead 102 thereby eliminating solder creep and electrical shorts.

It has been unexpectedly identified that the conductive layer 116 provides a reliable electrical connection between the lead 102 and an external system.

It has been unexpectedly observed that the interconnect structure 124 directly on the lead 102 and the passivation 118 provides a simple process flow and package structure for flip chip packaging.

It has been unexpectedly uncovered that the outer pad 126 and the inner pad 142 having reduced pad pitch significantly reduces a die size of the integrated circuit 144 resulting in reduction of a package footprint.

Referring now to FIG. 2, therein is shown a bottom view of the integrated circuit packaging system 100. The integrated circuit packaging system 100 can include multiple rows of a number of the lead 102. The integrated circuit packaging system 100 can include a peripheral array of a number of the lead 102.

The lead 102 can be formed adjacent or inside a passivation perimeter 202 of the passivation 118. The lead 102 can include the horizontal ridge 110 having the ridge lower side 112 extending from the conductive layer 116.

For illustrative purposes, the lead 102 or the conductive layer 116 is shown in a shape of a square, although it is understood that the lead 102 or the conductive layer 116 can be formed in any shapes. For example, the lead 102 or the conductive layer 116 can be formed in a shape of a circle.

Figure 3:
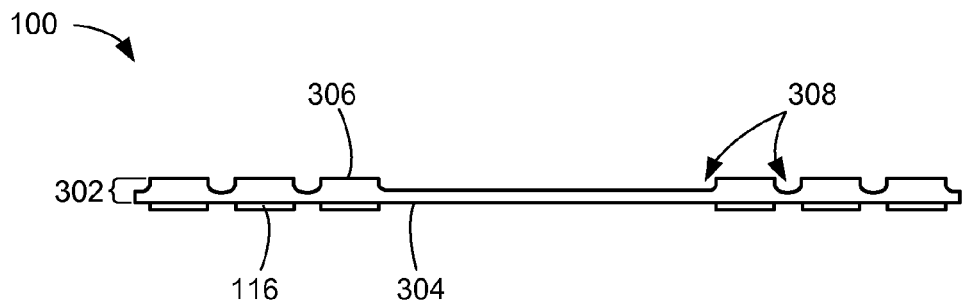
FIG. 3 is a cross-sectional view of the integrated circuit packaging system taken along line 3-3 of FIG. 4 in a plating phase of manufacture.
Figure 4:
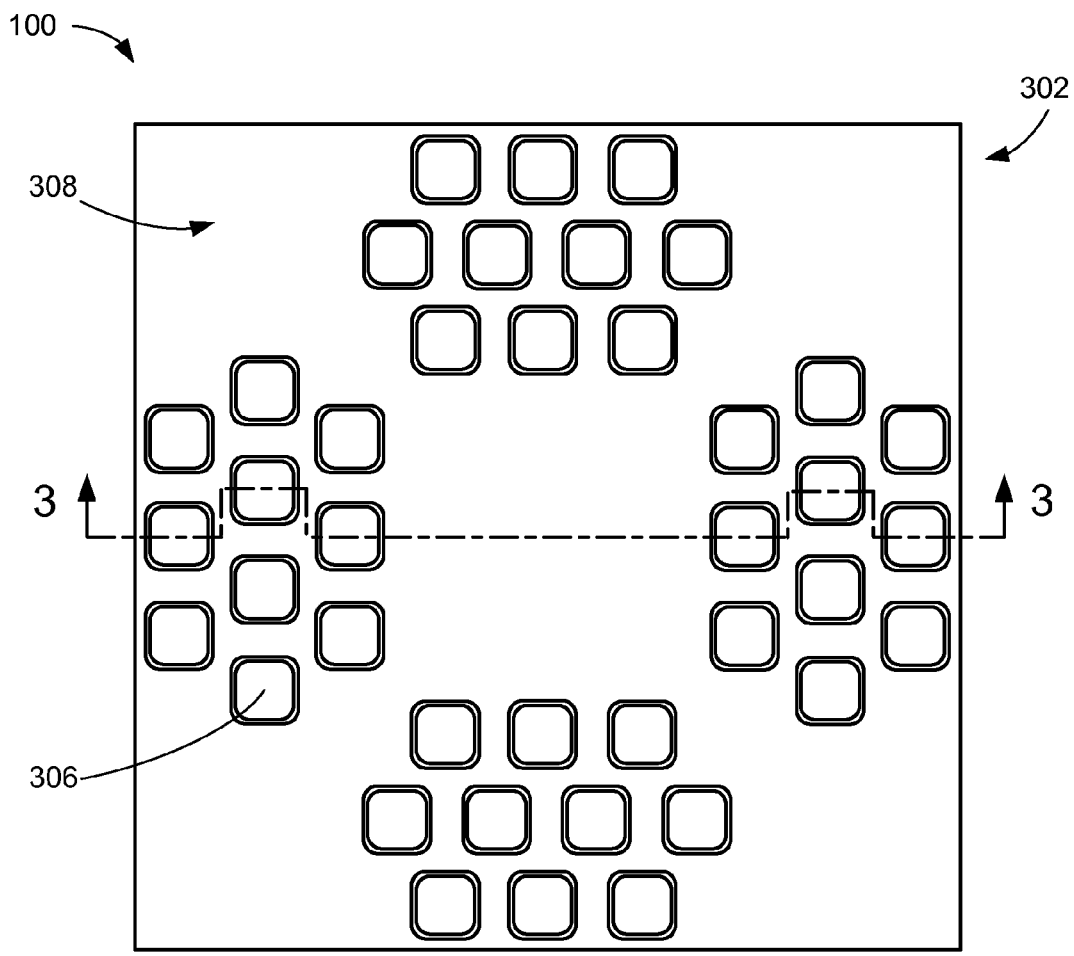
FIG. 4 is a top view of the integrated circuit packaging system in the plating phase.

Referring now to FIG. 3, therein is shown a cross-sectional view of the integrated circuit packaging system 100 taken along line 3-3 of FIG. 4 in a plating phase of manufacture. The cross-sectional view depicts the plating phase of a leadframe manufacture phase.

The integrated circuit packaging system 100 can include a leadframe 302, which is a structure for mounting and connecting a semiconductor device thereto. For example, the leadframe 302 can include a leadframe process dimension tolerance or accuracy of approximately 0.015 millimeter (mm).

The leadframe 302 can be formed with an electrically conductive material including copper (Cu) or any other metallic material. The leadframe 302 can be provided to enable flip chip integrated circuit (IC) packaging in a multi-row quad flat nonleaded (QFN) package. For example, the leadframe 302 can include a bare copper base or a multi-row copper leadframe.

The leadframe 302 can include a leadframe bottom side 304 and a leadframe top side 306 opposite the leadframe bottom side 304. A portion of the leadframe 302 at the leadframe top side 306 can be removed to form a partially removed region 308. The partially removed region 308 can be formed with a removal process including etching.

For example, the partially removed region 308 can be formed with the leadframe 302 half-etched. Also for example, the cross-sectional view depicts the leadframe 302 as an etched copper base.

The integrated circuit packaging system 100 can include the conductive layer 116 formed directly on the leadframe bottom side 304. The conductive layer 116 can be formed with an electrically conductive material including a metallic material or a metal alloy. For example, the conductive layer 116 can be formed with nickel-palladium (NiPd).

As an example, the conductive layer 116 can be formed with a plating process. As another example, the conductive layer 116 can be selectively pre-plated.

Referring now to FIG. 4, therein is shown a top view of the integrated circuit packaging system 100 in the plating phase. The integrated circuit packaging system 100 can include the leadframe 302 having the partially removed region 308. The partially removed region 308 can be formed at the leadframe top side 306.

Figure 5:
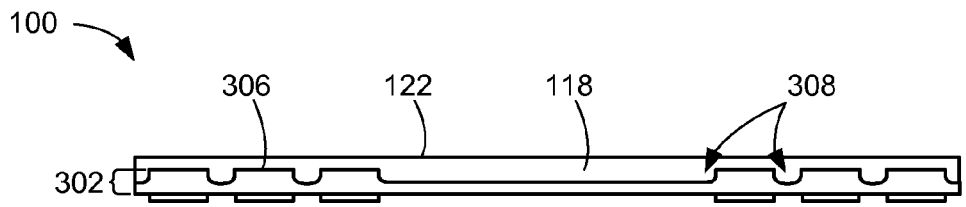
FIG. 5 is the structure of FIG. 3 in an application phase.

Referring now to FIG. 5, therein is shown the structure of FIG. 3 in an application phase. The passivation 118 can be formed with an application process in the application phase. The passivation 118 can be applied over the leadframe 302.

The passivation 118 can be formed directly on the leadframe top side 306 and the partially removed region 308. The passivation 118 can be formed with the passivation top side 122 above the leadframe top side 306. For example, the passivation 118 can be formed with a material including solder resist.

Figure 6:
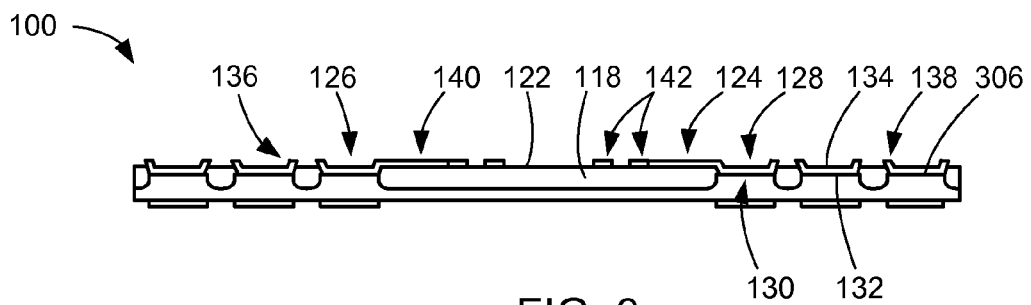
FIG. 6 is the structure of FIG. 5 taken along line 6-6 of FIG. 7 in a forming phase.
Figure 7:
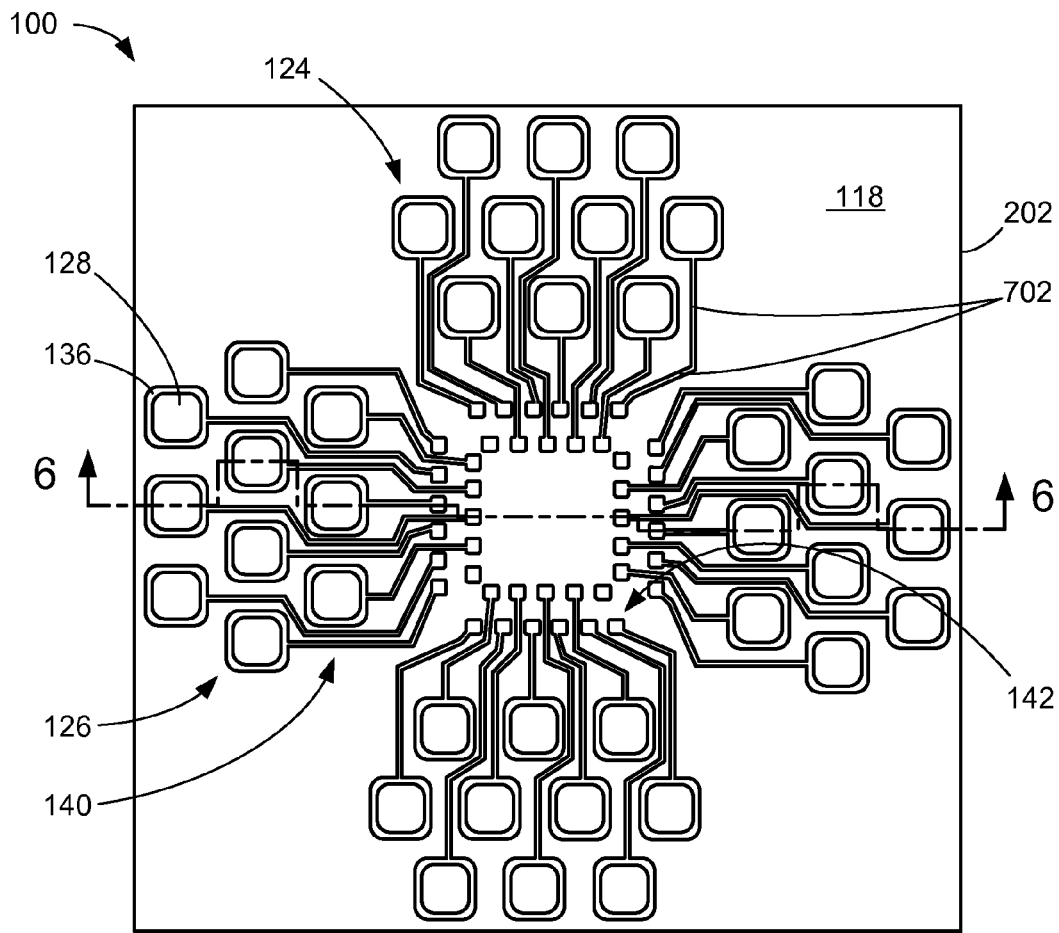
FIG. 7 is a top view of the integrated circuit packaging system in the forming phase.

Referring now to FIG. 6, therein is shown the structure of FIG. 5 taken along line 6-6 of FIG. 7 in a forming phase. The integrated circuit packaging system 100 can include an interconnect formation method including build-up or patterning.

A portion of the passivation 118 at the passivation top side 122 can be removed to expose the leadframe top side 306 from the passivation 118. The interconnect structure 124 can be formed directly on the leadframe top side 306 exposed from the passivation 118.

The interconnect structure 124 can include the outer pad 126 formed directly on the leadframe top side 306 exposed from the passivation 118. The interconnect structure 124 can include the outer pad 126, the conductive trace 140, and the inner pad 142 formed as a single integral structure with a common electrically conductive material.

The interconnect structure 124 can be formed with an electrically conductive material including a metallic material or a metal alloy. For example, the interconnect structure 124 can be formed with nickel-palladium (NiPd).

The outer pad 126 can include the recess 128, the non-vertical base 130, and the non-horizontal sidewall 136. The recess 128 can be formed above the base top surface 134 of the non-vertical base 130. The recess 128 can be surrounded by the non-horizontal sidewall 136. The non-vertical base 130 can include the base bottom surface 132 above or directly on the leadframe top side 306 exposed from the passivation 118.

The non-horizontal sidewall 136 can upwardly extend from the non-vertical base 130. The non-horizontal sidewall 136 can extend from the base top surface 134. The non-horizontal sidewall 136 can include the top end 138 above the passivation top side 122 and the base top surface 134.

The interconnect structure 124 can include the conductive trace 140 and the inner pad 142. The conductive trace 140 can be attached or connected to the top end 138. The conductive trace 140 can be formed directly on the passivation top side 122.

The inner pad 142 can be attached or connected to the conductive trace 140. The inner pad 142 can be formed directly on the passivation top side 122.

To improve miniaturization, the integrated circuit packaging system 100 can include another embodiment with a number of passivation layers, such as the passivation 118, and a number of traces, such as the conductive trace 140, to provide a full input/output (I/O) array capability. For example, the integrated circuit packaging system 100 can include two of the passivation 118 and a number of the conductive trace 140 directly on the passivation 118.

Referring now to FIG. 7, therein is shown a top view of the integrated circuit packaging system 100 in the forming phase. The top view depicts a number of the interconnect structure 124. The interconnect structure 124 can include the outer pad 126 having the recess 128 surrounded by the non-horizontal sidewall 136. The interconnect structure 124 can include the conductive trace 140 and the inner pad 142.

The integrated circuit packaging system 100 can include a number of the outer pad 126 connected to a number of the inner pad 142 with a number of the conductive trace 140. The integrated circuit packaging system 100 can include multiple rows of the outer pad 126. The integrated circuit packaging system 100 can include multiple rows of the inner pad 142.

The integrated circuit packaging system 100 can include a peripheral array of a number of the outer pad 126. The outer pad 126 can be formed adjacent or inside the passivation perimeter 202 of the passivation 118.

The integrated circuit packaging system 100 can include an array of a number of the inner pad 142. The inner pad 142 can be formed at a central portion of the passivation 118. The inner pad 142 can be formed closer to the central portion of the passivation 118 than the outer pad 126.

The conductive trace 140 can be formed with a number of segments 702, which are sections of the conductive trace 140 that are contiguously formed and connected between the outer pad 126 and the inner pad 142. The segments 702 can be formed as a single integral structure.

The segments 702 can be formed at a predetermined angle between one another. The predetermined angle helps separate a distance between an array of the outer pad 126 for improved connection to a stack device or an external system level (not shown). For example, the predetermined angle can depend on design guidelines or geometry constraints.

Figure 8:
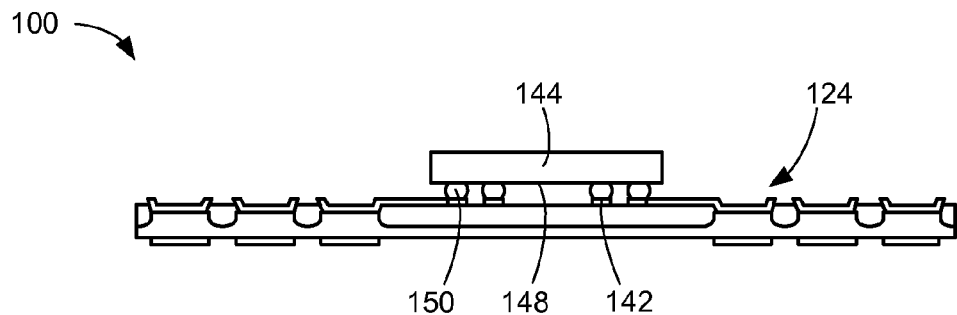
FIG. 8 is the structure of FIG. 6 in a mounting phase.

Referring now to FIG. 8, therein is shown the structure of FIG. 6 in a mounting phase. The mounting phase can include a phase in an integrated circuit (IC) packaging assembly phase. For example, the integrated circuit packaging system 100 can include a flip chip attachment method with an incoming routed leadframe in the mounting phase.

The integrated circuit packaging system 100 can include the integrated circuit 144 mounted over the interconnect structure 124. The integrated circuit 144 can include the active side 148 facing the interconnect structure 124. For example, the integrated circuit packaging system 100 can include the integrated circuit 144 having a silicon (Si) die area smaller than that of packages with laminate products.

The integrated circuit packaging system 100 can include the internal connector 150 connected to the inner pad 142 and the active side 148. The internal connector 150 can be directly on the inner pad 142.

For illustrative purposes, the internal connector 150 is shown as a conductive bump, although it is understood that the internal connector 150 can include any other electrically conductive connectors. For example, the internal connector 150 can include a conductive paste. Also for example, the internal connector 150 can be formed with a conductive material including solder, a metal, or a metallic alloy.

Figure 9:
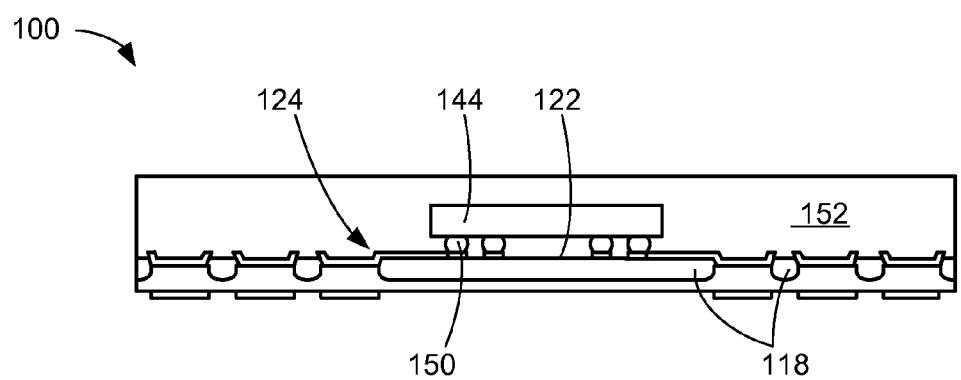
FIG. 9 is the structure of FIG. 8 in a molding phase.

Referring now to FIG. 9, therein is shown the structure of FIG. 8 in a molding phase. The integrated circuit packaging system 100 can include the encapsulation 152 molded over the passivation 118, the interconnect structure 124, the integrated circuit 144, and the internal connector 150. The encapsulation 152 can be formed covering the passivation top side 122, the interconnect structure 124, the integrated circuit 144, and the internal connector 150.

Figure 10:
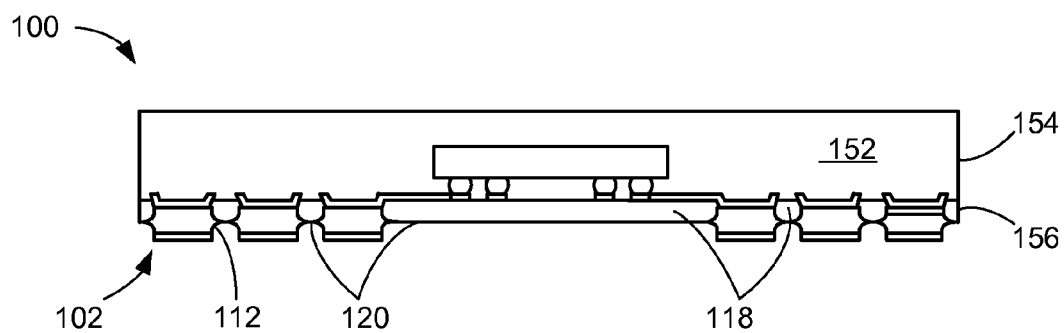
FIG. 10 is the structure of FIG. 9 in a removal phase.

Referring now to FIG. 10, therein is shown the structure of FIG. 9 in a removal phase. The integrated circuit packaging system 100 can include a removal process including etching in the removal phase. For example, the removal process can include copper etch.

A portion of the leadframe 302 of FIG. 3 at the leadframe bottom side 304 of FIG. 3 can be removed forming the lead 102. The lead 102 can be electrically isolated from another of the lead 102. The ridge lower side 112 of the lead 102 and the passivation bottom side 120 can be exposed with the portion of the leadframe 302 at the leadframe bottom side 304 removed.

The integrated circuit packaging system 100 can include a package singulation process to produce individual units or packages of the integrated circuit packaging system 100. The package singulation process can include a mechanical or optical process.

The encapsulation 152 can include the encapsulation non-horizontal side 154. A plane of the encapsulation non-horizontal side 154 can be coplanar with a plane of the passivation non-horizontal side 156 of the passivation 118.

Figure 11:
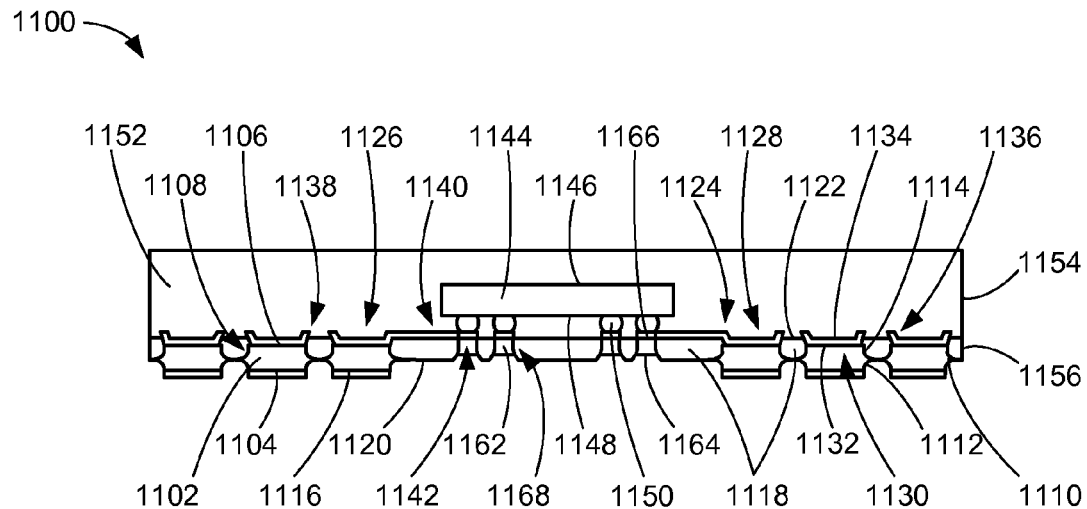
FIG. 11 is a cross-sectional view of an integrated circuit packaging system in a second embodiment of the present invention.

Referring now to FIG. 11, therein is shown a cross-sectional view of an integrated circuit packaging system 1100 in a second embodiment of the present invention. The integrated circuit packaging system 1100 can be similar to the integrated circuit packaging system 100 of FIG. 1, except for an addition of an electrical connector and the formation of the passivation 118 of FIG. 1 and the inner pad 142 of FIG. 1.

The integrated circuit packaging system 1100 can include a lead 1102, which provides electrical connectivity between the integrated circuit packaging system 1100 and an external system (not shown). The lead 1102 can include a lead bottom side 1104 and a lead top side 1106 opposite the lead bottom side 1104. The lead 1102 can include a lead non-horizontal side 1108 between the lead bottom side 1104 and the lead top side 1106.

The lead 1102 can include a horizontal ridge 1110, which is an end of the lead 1102, horizontally protruding from the lead non-horizontal side 1108. The horizontal ridge 1110 can be formed between the lead bottom side 1104 and the lead top side 1106.

The horizontal ridge 1110 can include a ridge lower side 1112 and a ridge upper side 1114 opposite the ridge lower side 1112. The ridge upper side 1114 can be above the ridge lower side 1112.

The integrated circuit packaging system 1100 can include a conductive layer 1116, which provides an electrical connection between the lead 1102 and an external system. The conductive layer 1116 can be electrically connected to the lead 1102. The conductive layer 1116 can be formed directly on the lead bottom side 1104.

The integrated circuit packaging system 1100 can include a passivation 1118, which protects a portion of the lead 1102. The passivation 1118 can electrically isolate the lead 1102 and another of the lead 1102.

The passivation 1118 can be formed surrounding an upper portion of the lead 1102. The passivation 1118 can be formed over the horizontal ridge 1110. The passivation 1118 can be formed directly on the ridge upper side 1114. A portion of the passivation 1118 can be formed over the lead top side 1106.

The passivation 1118 can include a passivation bottom side 1120 and a passivation top side 1122 opposite the passivation bottom side 1120. The passivation top side 1122 can be above the lead top side 1106.

The passivation bottom side 1120 can extend between the horizontal ridge 1110 of the lead 1102 and another of the horizontal ridge 1110 of another of the lead 1102. The passivation bottom side 1120 can be above the ridge lower side 1112 or the conductive layer 1116.

The integrated circuit packaging system 1100 can include an interconnect structure 1124, which is a structure that provides electrical connectivity between a semiconductor device and the lead 1102. The interconnect structure 1124 can include an outer pad 1126, which provides electrical connectivity to the lead 1102, over or directly on the lead top side 1106. For example, the interconnect structure 1124 can include a redistribution layer (RDL) on a multi-row copper leadframe.

The outer pad 1126 can include a recess 1128. The outer pad 1126 can include a non-vertical base 1130, which is a bottom of the outer pad 1126, having a base bottom surface 1132 and a base top surface 1134 opposite the base bottom surface 1132. The outer pad 1126 can include a non-horizontal sidewall 1136, which is a portion of the outer pad 1126 that upwardly extends from the non-vertical base 1130.

The outer pad 1126 can include the base top surface 1134 and the non-horizontal sidewall 1136 bounding the recess 1128. The outer pad 1126 can include the non-horizontal sidewall 1136 surrounding the recess 1128.

The non-horizontal sidewall 1136 can extend from the base top surface 1134. The non-horizontal sidewall 1136 can be formed at an obtuse angle with the base top surface 1134. The non-horizontal sidewall 1136 can include a top end 1138, which is an extent at a top of the non-horizontal sidewall 1136. The top end 1138 can be above the passivation top side 1122 and the base top surface 1134.

For illustrative purposes, a plane of the base top surface 1134 is shown coplanar with a plane of the passivation top side 1122, although it is understood that the base top surface 1134 and the passivation top side 1122 can be at different planes. For example, a plane of the base top surface 1134 can be below a plane of the passivation top side 1122.

The interconnect structure 1124 can include a conductive trace 1140 and an inner pad 1142. The conductive trace 1140 provides or routes electrical connection between the outer pad 1126 and the inner pad 1142. The inner pad 1142 provides mounting support and electrical connectivity to a semiconductor device. The inner pad 1142 can be attached or connected to the conductive trace 1140.

The conductive trace 1140 can be attached or connected to the top end 1138 of the non-horizontal sidewall 1136. The conductive trace 1140 can be formed directly on the passivation top side 1122. For example, the conductive trace 1140 can include an electrical connector including a redistribution trace, a routed nickel-palladium (NiPd) layer, a pre plated frame (PPF) layer, or a redistribution layer (RDL).

The integrated circuit packaging system 1100 can include an integrated circuit 1144, which is a semiconductor device. The integrated circuit 1144 can include an inactive side 1146 and an active side 1148 opposite the inactive side 1146. For example, the integrated circuit 1144 can include a semiconductor device including a flip chip or a silicon (Si) die.

The integrated circuit 1144 can include the active side 1148 facing the interconnect structure 1124. The integrated circuit 1144 can be mounted over the interconnect structure 1124.

The integrated circuit packaging system 1100 can include an internal connector 1150, which is an electrically conductive connector. The internal connector 1150 can be attached to the inner pad 1142 and the active side 1148. The internal connector 1150 can be directly on the inner pad 1142.

The integrated circuit packaging system 1100 can include the passivation 1118 electrically isolating the interconnect structure 1124 from another of the interconnect structure 1124. The integrated circuit packaging system 1100 can include a number of the outer pad 1126 surrounding or outside a perimeter of the integrated circuit 1144. The integrated circuit packaging system 1100 can include a number of the inner pad 1142 under the inactive side 1146 of the integrated circuit 1144.

The integrated circuit packaging system 1100 can include an encapsulation 1152, which covers a semiconductor package to seal a semiconductor device providing mechanical and environmental protection. The encapsulation 1152 can be formed over the passivation 1118, the interconnect structure 1124, the integrated circuit 1144, and the internal connector 1150. The encapsulation 1152 can be formed covering the passivation top side 1122, the interconnect structure 1124, the integrated circuit 1144, and the internal connector 1150.

The encapsulation 1152 can include an encapsulation non-horizontal side 1154, which is a horizontal extent of the encapsulation 1152. A plane of the encapsulation non-horizontal side 1154 can be coplanar with a plane of a passivation non-horizontal side 1156 of the passivation 1118. The passivation non-horizontal side 1156 is a horizontal extent of the passivation 1118.

The integrated circuit packaging system 1100 can include a pillar 1162, which is an electrical connector that provides connectivity between the integrated circuit 1144 and an external system. The pillar 1162 can include a pillar bottom side 1164 and a pillar top side 1166 opposite the pillar bottom side 1164. The pillar 1162 can include the pillar top side 1166 with the inner pad 1142 formed directly thereon.

For illustrative purposes, the pillar bottom side 1164 is shown with a width greater than a width of the pillar top side 1166, although it is understood that the pillar bottom side 1164 and the pillar top side 1166 can include any other widths. For example, the pillar bottom side 1164 can include a width approximately equal to a width of the pillar top side 1166. Widths of the pillar bottom side 1164 and the pillar top side 1166 are horizontal distances between horizontal extents of the pillar bottom side 1164 and the pillar top side 1166, respectively.

Also for illustrative purposes, the pillar bottom side 1164 is shown with a straight surface, although it is understood that the pillar bottom side 1164 can include any other surface. For example, the pillar bottom side 1164 can include a curved surface including a concave surface.

The pillar 1162 can include a pillar non-horizontal side 1168 between the pillar bottom side 1164 and the pillar top side 1166. A plane of a portion of the pillar non-horizontal side 1168 can intersect a plane of the pillar bottom side 1164 or a plane of the pillar top side 1166.

For illustrative purposes, the pillar non-horizontal side 1168 is shown with a curved surface, although it is understood that the pillar non-horizontal side 1168 can include any other surface. For example, the pillar non-horizontal side 1168 can include a straight surface.

The passivation 1118 can electrically isolate the pillar 1162 and another of the pillar 1162. The passivation 1118 can be formed surrounding or directly on the pillar non-horizontal side 1168. The passivation 1118 can include a central portion or region at which a number of the pillar 1162 can be formed, adjacent, or surrounded by a number of the lead 1102 with the pillar non-horizontal side 1168 facing the lead non-horizontal side 1108 or the horizontal ridge 1110.

The pillar bottom side 1164 and the pillar top side 1166 can be exposed from the passivation 1118. A plane of a portion of the pillar bottom side 1164 can be above a plane of the passivation bottom side 1120. A plane of the pillar top side 1166 can be coplanar with a plane of the passivation top side 1122.

The pillar 1162 can include a smaller size compared to that of the lead 1102. In other words, the pillar 1162 can include a height less than a height of the lead 1102 or a width less than a width of the lead 1102. Heights of the pillar 1162 and the lead 1102 are vertical distances between vertical extents of the pillar 1162 and the lead 1102, respectively. Widths of the pillar 1162 and the lead 1102 are horizontal distances between horizontal extents of the pillar 1162 and the lead 1102, respectively. For example, the pillar 1162 can include a height less than or approximately equal to half of a height of the lead 1102.

The pillar 1162 can include a pitch finer than a pitch of the lead 1102. In other words, the pillar 1162 can include a pitch less than a pitch of the lead 1102. A pitch of the pillar 1162 is a horizontal distance between a center of the pillar 1162 and a center of another of the pillar 1162 that is closest to the pillar 1162. A pitch of the lead 1102 is a horizontal distance between a center of the lead 1102 and a center of another of the lead 1102 that is closest to the lead 1102.

It has been discovered that the pillar 1162 improves test quality with the pillar 1162 functioning as a test point to facilitate functionality testing of the integrated circuit 1144.

It has also been discovered that the pillar 1162 improves reliability with the pillar 1162 having a robust structure on which the inner pad 1142 is formed to support and connect the integrated circuit 1144.

Figure 12:
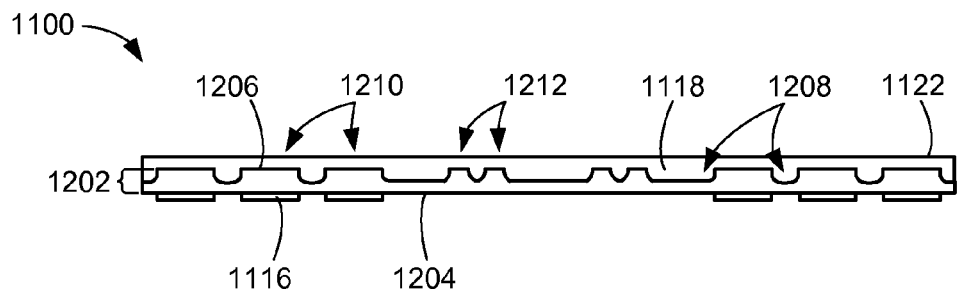
FIG. 12 is a cross-sectional view of the integrated circuit packaging system in an application phase of manufacture.

Referring now to FIG. 12, therein is shown a cross-sectional view of the integrated circuit packaging system 1100 in an application phase of manufacture. The integrated circuit packaging system 1100 can include a leadframe 1202, which is a support structure that is used to mount and connect a semiconductor device. The leadframe 1202 can be formed with an electrically conductive material including copper (Cu) or any other metallic material.

The leadframe 1202 can include a leadframe bottom side 1204 and a leadframe top side 1206 opposite the leadframe bottom side 1204. A portion of the leadframe 1202 at the leadframe top side 1206 can be removed to form a partially removed region 1208. The partially removed region 1208 can be formed with a removal process including etching.

The leadframe 1202 can include wide regions 1210 and narrow regions 1212, which are non-removed portions of the leadframe 1202 that remain unprocessed by the removal process. A number of the narrow regions 1212 can be surrounded by a number of the wide regions 1210. The wide regions 1210 and the narrow regions 1212 can be further processed in subsequent phases to form leads and pillars, respectively, to which a semiconductor device can be connected.

The wide regions 1210 can include widths greater than widths of the narrow regions 1212. Widths of the wide regions 1210 and the narrow regions 1212 are horizontal distances between horizontal extents of the wide regions 1210 and the narrow regions 1212, respectively.

The integrated circuit packaging system 1100 can include the conductive layer 1116 formed directly on the leadframe bottom side 1204. The conductive layer 1116 can be formed below the wide regions 1210. The conductive layer 1116 can be formed with an electrically conductive material including a metallic material or a metal alloy.

For example, the conductive layer 1116 can be formed with nickel-palladium (NiPd). Also for example, the conductive layer 1116 can be formed with a plating process including a selectively pre-plated process.

The passivation 1118 can be formed with an application process in the application phase. The passivation 1118 can be applied over the leadframe 1202. The passivation 1118 can be formed directly on the leadframe top side 1206 and the partially removed region 1208. The passivation 1118 can be formed with the passivation top side 1122 above the leadframe top side 1206. For example, the passivation 1118 can be formed with an insulation material including solder resist.

Figure 13:
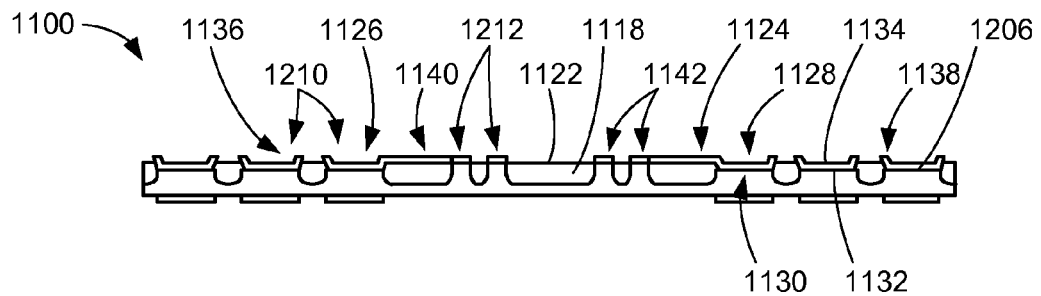
FIG. 13 is the structure of FIG. 12 in a forming phase.

Referring now to FIG. 13, therein is shown the structure of FIG. 12 in a forming phase. The integrated circuit packaging system 1100 can include an interconnect formation method including build-up or patterning.

A portion of the passivation 1118 at the passivation top side 1122 can be removed to expose top sides of the wide regions 1210 and top sides of the narrow regions 1212 from the passivation 1118. The interconnect structure 1124 can be formed directly on top sides of the wide regions 1210 and top sides of the narrow regions 1212.

The interconnect structure 1124 can include the outer pad 1126 formed directly on a top side of one of the wide regions 1210. The interconnect structure 1124 can include the outer pad 1126, the conductive trace 1140, and the inner pad 1142 formed as a single integral structure with a common electrically conductive material.

The interconnect structure 1124 can be formed with an electrically conductive material including a metallic material or a metal alloy. For example, the interconnect structure 1124 can be formed with nickel-palladium (NiPd).

The outer pad 1126 can include the recess 1128, the non-vertical base 1130, and the non-horizontal sidewall 1136. The recess 1128 can be formed above the base top surface 1134 of the non-vertical base 1130. The recess 1128 can be surrounded by the non-horizontal sidewall 1136. The non-vertical base 1130 can include the base bottom surface 1132 above or directly on the leadframe top side 1206 exposed from the passivation 1118.

The non-horizontal sidewall 1136 can upwardly extend from the non-vertical base 1130. The non-horizontal sidewall 1136 can extend from the base top surface 1134. The non-horizontal sidewall 1136 can include the top end 1138 above the passivation top side 1122 and the base top surface 1134.

The interconnect structure 1124 can include the conductive trace 1140. The conductive trace 1140 can be attached or connected to the top end 1138. The conductive trace 1140 can be formed directly on the passivation top side 1122.

The interconnect structure 1124 can include the inner pad 1142. The inner pad 1142 can be attached or connected to the conductive trace 1140. The inner pad 1142 can be formed directly on a top side of one of the narrow regions 1212.

Figure 14:
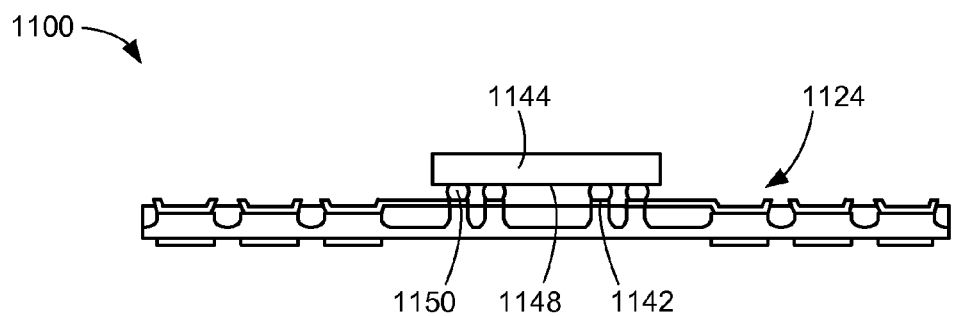
FIG. 14 is the structure of FIG. 13 in a mounting phase.

Referring now to FIG. 14, therein is shown the structure of FIG. 13 in a mounting phase. The integrated circuit packaging system 1100 can include the integrated circuit 1144 mounted over the interconnect structure 1124. The integrated circuit 1144 can include the active side 1148 facing the interconnect structure 1124.

The integrated circuit packaging system 1100 can include the internal connector 1150 connected to the inner pad 1142 and the active side 1148. The internal connector 1150 can be directly on the inner pad 1142.

Figure 15:
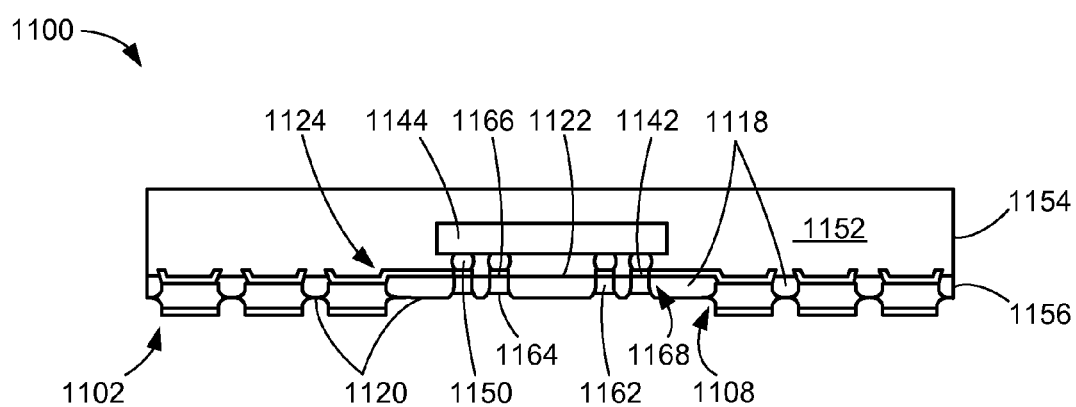
FIG. 15 is the structure of FIG. 14 in a removal phase.

Referring now to FIG. 15, therein is shown the structure of FIG. 14 in a removal phase. The integrated circuit packaging system 1100 can include the encapsulation 1152 molded over the passivation 1118, the interconnect structure 1124, the integrated circuit 1144, and the internal connector 1150. The encapsulation 1152 can be formed covering the passivation top side 1122, the interconnect structure 1124, the integrated circuit 1144, and the internal connector 1150.

The integrated circuit packaging system 1100 can include a removal process including etching in the removal phase. For example, the removal process can include copper (Cu) back etching.

A portion of the leadframe 1202 of FIG. 12 at the leadframe bottom side 1204 of FIG. 12 can be removed forming the lead 1102 and the pillar 1162. The lead 1102 can be electrically isolated from another of the lead 1102. The pillar 1162 can be adjacent or surrounded by a number of the lead 1102 with the pillar non-horizontal side 1168 facing the lead non-horizontal side 1108. The passivation bottom side 1120 can be exposed with the portion of the leadframe 1202 at the leadframe bottom side 1204 removed.

The integrated circuit packaging system 1100 can include a package singulation process to produce individual units or packages of the integrated circuit packaging system 1100. The package singulation process can include a mechanical or optical process.

The encapsulation 1152 can include the encapsulation non-horizontal side 1154. A plane of the encapsulation non-horizontal side 1154 can be coplanar with a plane of the passivation non-horizontal side 1156 of the passivation 1118.

The integrated circuit packaging system 1100 can include the pillar 1162 having the pillar bottom side 1164 and the pillar top side 1166. The pillar 1162 can include the pillar top side 1166 with the inner pad 1142 formed directly thereon.

The pillar 1162 can include the pillar non-horizontal side 1168 between the pillar bottom side 1164 and the pillar top side 1166. A plane of a portion of the pillar non-horizontal side 1168 can intersect a plane of the pillar bottom side 1164 or a plane of the pillar top side 1166.

The pillar bottom side 1164 and the pillar top side 1166 can be exposed from the passivation 1118. A plane of a portion of the pillar bottom side 1164 can be above a plane of the passivation bottom side 1120. A plane of the pillar top side 1166 can be coplanar with a plane of the passivation top side 1122.

Figure 16:
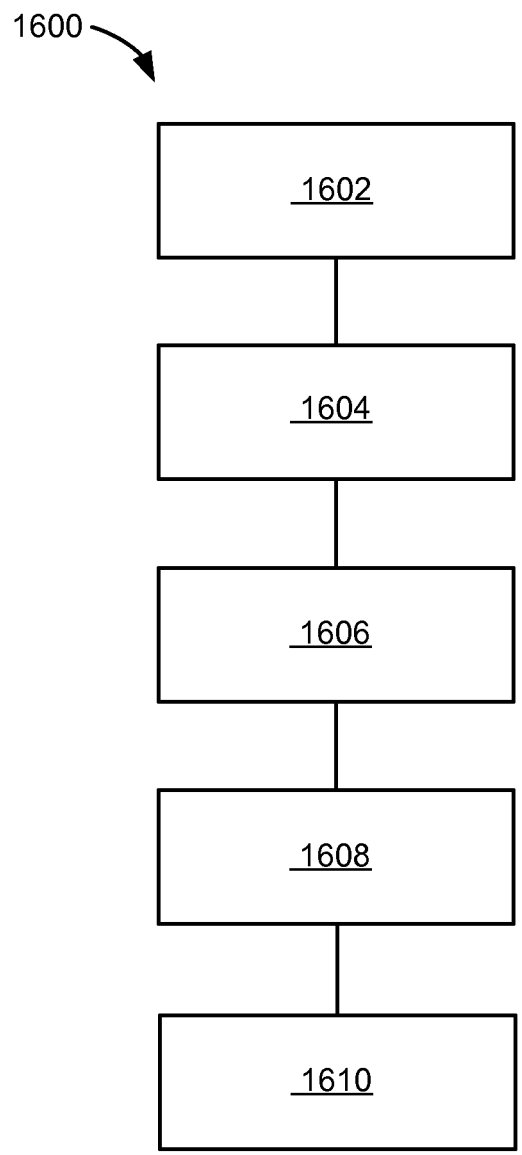
FIG. 16 is a flow chart of a method of manufacture of the integrated circuit packaging system in a further embodiment of the present invention.

Referring now to FIG. 16, therein is shown a flow chart of a method 1600 of manufacture of the integrated circuit packaging system 100 in a further embodiment of the present invention. The method 1600 includes: forming a lead having a lead bottom side and a lead top side in a block 1602; applying a passivation over the lead with the lead top side exposed from the passivation in a block 1604; forming an interconnect structure directly on the passivation and the lead top side, the interconnect structure having an inner pad and an outer pad with a recess above the lead top side in a block 1606; mounting an integrated circuit over the inner pad and the passivation in a block 1608; and molding an encapsulation over the integrated circuit in a block 1610.

Thus, it has been discovered that the integrated circuit packaging system of the present invention furnishes important and heretofore unknown and unavailable solutions, capabilities, and functional aspects for an integrated circuit packaging system with connection. The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit packaging systems fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
    forming multiple rows of leads, one of the leads having a lead bottom side and a lead top side;
    applying a passivation over the one of the leads with the lead top side exposed from the passivation;
    forming an interconnect structure directly on the passivation and the lead top side, the interconnect structure having an inner pad and an outer pad with a recess above the lead top side, wherein the interconnect structure connects the inner pad to the outer pad and the outer pad is directly on the lead top side;
    mounting an integrated circuit over the inner pad and the passivation, wherein the multiple rows of the leads are outside a perimeter of the integrated circuit; and
    molding an encapsulation over the integrated circuit.

2. The method as claimed in claim 1 wherein forming the interconnect structure includes forming the interconnect structure having the outer pad with a non-vertical base directly on the lead top side.

3. The method as claimed in claim 1 wherein forming the interconnect structure includes forming the interconnect structure having a conductive trace attached to the inner pad and the outer pad.

4. The method as claimed in claim 1 wherein forming the multiple rows of the leads includes forming the one of the leads having a horizontal ridge between the lead bottom side and the lead top side.

5. The method as claimed in claim 1 further comprising forming a pillar having a pillar non-horizontal side facing a lead non-horizontal side of the one of the leads.

6. A method of manufacture of an integrated circuit packaging system comprising:
    forming multiple rows of leads, one of the leads having a lead bottom side and a lead top side;
    applying a passivation over the one of the leads with the lead top side exposed from the passivation;
    forming an interconnect structure directly on the passivation and the lead top side, the interconnect structure having an inner pad and an outer pad with a recess above the lead top side, wherein the interconnect structure connects the inner pad to the outer pad and the outer pad is directly on the lead top side;
    mounting an integrated circuit over the inner pad and the passivation, wherein the multiple rows of the leads are outside a perimeter of the integrated circuit;
    attaching an internal connector to the integrated circuit and the inner pad; and
    molding an encapsulation over the integrated circuit.

7. The method as claimed in claim 6 wherein forming the interconnect structure includes forming the interconnect structure having a non-horizontal sidewall extending from a non-vertical base directly on the lead top side.

8. The method as claimed in claim 6 wherein forming the interconnect structure includes forming the interconnect structure having a conductive trace attached to and integral with the inner pad and the outer pad.

9. The method as claimed in claim 6 wherein:
    forming the multiple rows of the leads includes forming the one of the leads having a horizontal ridge between the lead bottom side and the lead top side; and
    applying the passivation includes applying the passivation directly on a ridge upper side of the horizontal ridge.

10. The method as claimed in claim 6 further comprising:
    forming a pillar having a pillar top side and a pillar non-horizontal side facing a lead non-horizontal side of the one of the leads; and
    wherein:
    forming the interconnect structure includes forming the interconnect structure having the inner pad directly on the pillar top side.

11. An integrated circuit packaging system comprising:
    multiple rows of leads, one of the leads having a lead bottom side and a lead top side;
    a passivation over the one of the leads with the lead top side exposed from the passivation;
    an interconnect structure directly on the passivation and the lead top side, the interconnect structure having an inner pad and an outer pad with a recess above the lead top side, wherein the interconnect structure connects the inner pad to the outer pad and the outer pad is directly on the lead top side;
    an integrated circuit over the inner pad and the passivation, wherein the multiple rows of the leads are outside a perimeter of the integrated circuit; and
    an encapsulation over the integrated circuit.

12. The system as claimed in claim 11 wherein the interconnect structure includes the outer pad with a non-vertical base directly on the lead top side.

13. The system as claimed in claim 11 wherein the interconnect structure includes a conductive trace attached to the inner pad and the outer pad.

14. The system as claimed in claim 11 wherein the one of the leads includes a horizontal ridge between the lead bottom side and the lead top side.

15. The system as claimed in claim 11 further comprising a pillar having a pillar non-horizontal side facing a lead non-horizontal side of the one of the leads.

16. The system as claimed in claim 11 further comprising an internal connector attached to the integrated circuit and the inner pad.

17. The system as claimed in claim 16 wherein the interconnect structure includes a non-horizontal sidewall extending from a non-vertical base directly on the lead top side.

18. The system as claimed in claim 16 wherein the interconnect structure includes a conductive trace attached to and integral with the inner pad and the outer pad.

19. The system as claimed in claim 16 wherein:
    the one of the leads includes a horizontal ridge between the lead bottom side and the lead top side; and
    the passivation is directly on a ridge upper side of the horizontal ridge.

20. The system as claimed in claim 16 further comprising:
    a pillar having a pillar top side and a pillar non-horizontal side facing a lead non-horizontal side of the one of the leads; and
    wherein:

the interconnect structure includes the inner pad directly on the pillar top side.

* * * * *